United States Patent
Wang et al.

(10) Patent No.: US 7,381,293 B2
(45) Date of Patent: Jun. 3, 2008

(54) CONVEX INSERT RING FOR ETCH CHAMBER

(75) Inventors: Ming-Yi Wang, Fengshau (TW); Jeng-Yen Tsai, Tainan (TW); Jeng-Chiang Chuang, Tainan (TW); Chon-Yai Tasi, Yungkang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 79 days.

(21) Appl. No.: 10/340,185

(22) Filed: Jan. 9, 2003

(65) Prior Publication Data
US 2004/0134617 A1 Jul. 15, 2004

(51) Int. Cl.
*H01L 21/00* (2006.01)
*C23C 16/00* (2006.01)

(52) U.S. Cl. ............ 156/345.51; 156/915; 156/345.52; 156/345.53; 204/298.01; 118/724; 118/728; 118/725; 279/128; 361/234

(58) Field of Classification Search ................. 156/915, 156/345.51, 345.52, 345.53; 118/724, 725, 118/728; 279/128; 361/234; 204/298.1, 204/298.01
See application file for complete search history.

(56) References Cited

U.S. PATENT DOCUMENTS

| 5,673,922 | A | * | 10/1997 | Sherstinsky et al. | ........ 279/133 |
| 5,964,947 | A | * | 10/1999 | Zhao et al. | ................. 118/715 |
| 6,008,130 | A | * | 12/1999 | Henderson et al. | ......... 438/710 |
| 6,063,440 | A | * | 5/2000 | Chen et al. | .............. 427/248.1 |
| 6,489,249 | B1 | * | 12/2002 | Mathad et al. | .............. 438/729 |
| 6,743,340 | B2 | * | 6/2004 | Fu | ........................ 204/192.12 |
| 2004/0000375 | A1 | * | 1/2004 | Liu et al. | ................. 156/345.3 |

FOREIGN PATENT DOCUMENTS

JP 11111818 A * 4/1999
JP 2001007090 A * 1/2001

* cited by examiner

*Primary Examiner*—Ram N. Kackar
(74) *Attorney, Agent, or Firm*—Tung & Associates

(57) ABSTRACT

A new and improved insert ring for a wafer support inside a processing chamber for the processing, particularly dry etching, of semiconductor wafer substrates. The insert ring includes a generally convex inner surface which faces the wafer support and defines a gap or berline wall between the insert ring and the wafer support. In one embodiment, the convex inner surface is convexly-tapered. In another embodiment, the convex inner surface is convexly-curved. Throughout etching of multiple successive substrates on the wafer support, accumulations of polymer material on the inner surface of the insert ring are prevented or at least substantially reduced. Consequently, polymer peeling is eliminated or reduced and operational intervals for the processing chamber or system between periodic maintenance or cleanings, are prolonged.

10 Claims, 2 Drawing Sheets

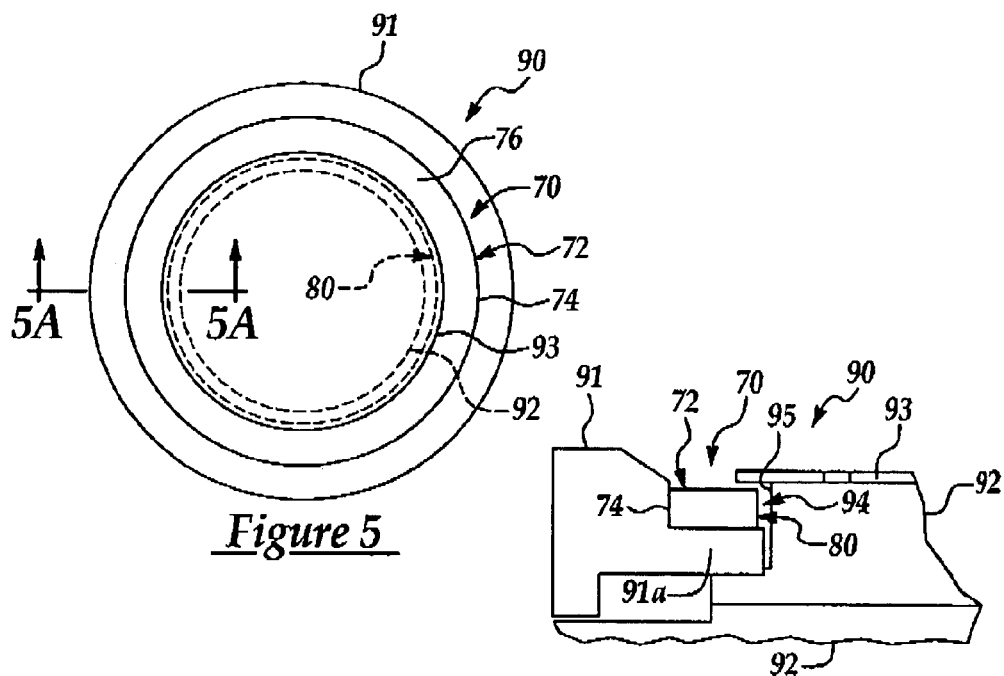

CONVEX INSERT RING FOR ETCH CHAMBER

FIELD OF THE INVENTION

The present invention relates to etch chambers used to etch circuit patterns on semiconductor wafer substrates in the fabrication of integrated circuits on the substrates. More particularly, the present invention relates to a convex insert ring that encircles an electrostatic chuck (ESC) in an etch chamber and provides a wider gap space for polymer formation between the insert ring and the ESC, eliminating polymer peeling and B/H alarm activation between PM cycles.

BACKGROUND OF THE INVENTION

Integrated circuits are formed on a semiconductor substrate, which is typically composed of silicon. Such formation of integrated circuits involves sequentially forming or depositing multiple electrically conductive and insulative layers in or on the substrate. Etching processes may then be used to form geometric patterns in the layers or vias for electrical contact between the layers. Etching processes include "wet" etching, in which one or more chemical reagents are brought into direct contact with the substrate, and "dry" etching, such as plasma etching.

Various types of plasma etching processes are known in the art, including plasma etching, reactive ion (RI) etching and reactive ion beam etching. In each of these plasma processes, a gas is first introduced into a reaction chamber and then plasma is generated from the gas. This is accomplished by dissociation of the gas into ions, free radicals and electrons by using an RF (radio frequency) generator, which includes one or more electrodes. The electrons are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material on the semiconductor wafer to form residual products which leave the wafer surface and thus, etch the material from the wafer.

Referring to the schematic of FIG. 1, a conventional plasma etching system, such as an Mxp+ Super-E etcher available from Applied Materials, Inc., is generally indicated by reference numeral 10. The etching system 10 includes a reaction chamber 12 having a typically grounded chamber wall 14. An electrode, such as a planar coil electrode 16, is positioned adjacent to a dielectric plate 18 which separates the electrode 16 from the interior of the reaction chamber 12. Plasma-generating source gases are provided by a gas supply (not shown). Volatile reaction products and unreacted plasma species are removed from the reaction chamber 12 by a gas removal mechanism, such as a vacuum pump 24 through a throttle valve 26.

The dielectric plate 18 illustrated in FIG. 1 may serve multiple purposes and have multiple structural features, as is well known in the art. For example, the dielectric plate 18 may include features for introducing the source gases into the reaction chamber 12, as well as those structures associated with physically separating the electrode 16 from the interior of the chamber 12.

Electrode power such as a high voltage signal is applied to the electrode 16 to ignite and sustain a plasma in the reaction chamber 12. Ignition of a plasma in the reaction chamber 12 is accomplished primarily by electrostatic coupling of the electrode 16 with the source gases, due to the large-magnitude voltage applied to the electrode 16 and the resulting electric fields produced in the reaction chamber 12. Once ignited, the plasma is sustained by electromagnetic induction effects associated with time-varying magnetic fields produced by the alternating currents applied to the electrode 16. The plasma may become self-sustaining in the reaction chamber 12 due to the generation of energized electrons from the source gases and striking of the electrons with gas molecules to generate additional ions, free radicals and electrons. A semiconductor wafer 34 is positioned in the reaction chamber 12 and is supported by a wafer platform or ESC (electrostatic chuck) 36. The ESC 36 is typically electrically-biased to provide ion energies that are independent of the RF voltage applied to the electrode 16 and that impact the wafer 34.

Typically, the voltage varies as a function of position along the coil electrode 16, with relatively higher-amplitude voltages occurring at certain positions along the electrode 16 and relatively lower-amplitude voltages occurring at other positions along the electrode 16. A relatively large electric field strength is required to ignite plasmas in the reaction chamber 12. Accordingly, to create such an electric field it is desirable to provide the relatively higher-amplitude voltages at locations along the electrode 16 which are close to the grounded chamber wall 14.

As discussed above, plasma includes high-energy ions, free radicals and electrons which react chemically with the surface material of the semiconductor wafer to form reaction produces that leave the wafer surface, thereby etching a geometrical pattern or a via in a wafer layer. Plasma intensity depends on the type of etchant gas or gases used, as well as the etchant gas pressure and temperature and the radio frequency generated at the electrode 16. If any of these factors changes during the process, the plasma intensity may increase or decrease with respect to the plasma intensity level required for optimum etching in a particular application. Decreased plasma intensity results in decreased, and thus incomplete, etching. Increased plasma intensity, on the other hand, can cause overetching and plasma-induced damage of the wafers. Plasma-induced damage includes trapped interface charges, material defects migration into bulk materials, and contamination caused by the deposition of etch products on material surfaces. Etch damage induced by reactive plasma can alter the qualities of sensitive IC components such as Schottky diodes, the rectifying capability of which can be reduced considerably. Heavy-polymer deposition during oxide contact hole etching may cause high-contact resistance.

FIG. 2 illustrates structural details of the environment of the ESC 36 inside the reaction chamber 12. A typically silicon insert ring 40 is interposed between a shadow ring 38 and the outer circumference of the ESC 36. The insert ring 40 enhances uniformity of the etch rate among all areas on the surface of the wafer 34. A gap 46 (known in the art as a berline wall) is defined between the flat inner edge 42 of the insert ring 40 and the outer circumference of the ESC 36. The edge of the wafer 34, resting on the ESC 36, may extend over the gap 46.

As shown in FIG. 3, throughout repeated processing of successive wafers 34 on the ESC 36, a deposit of polymer material 44 tends to gradually accumulate on the outer edge of the ESC 36, and extends into the gap 46. This deposit of polymer material 44 gradually grows and closes or substantially narrows the gap 46, finally becoming deposited on the flat inner edge 42 of the insert ring 40. This excessively increases the leakage of helium from the backside of the wafer 34 during etching, thereby energizing the B/H alarm of the etching system between PM (periodic maintenance) cycles. Furthermore, accumulation of the polymer material 44 onto the insert ring 40 causes peeling of polymer particles from the ESC 36 and the insert ring 40. These polymer particles can potentially contaminate devices being formed on the wafers 34. Consequently, the ESC 36 and the insert ring 40 must be wet-cleaned about every 70 hours of operation of the system 10.

One of the approaches which has been taken to retard the accumulation of the polymer deposit 44 on the insert ring 40 has included widening or narrowing of the gap 46. However, this tends to increase deposition of the polymer deposit 44 on, and accelerate polymer peeling from, the insert ring 40.

Therefore, the present invention is directed at providing an insert ring having a convex inner surface to prevent or minimize the deposition of polymer material on the insert ring, and thus, eliminate or reduce the peeling of polymer material from the insert ring.

It is therefore an object of the present invention to provide a novel insert ring for a wafer support, which insert ring prevents or minimizes the formation of polymer material thereon during processing of wafers on the support.

Another object of the present invention is to provide a novel wafer support insert ring having a convex inner surface to prevent or minimize the formation of polymer material on the inner surface of the ring.

Still another object of the present invention is to provide a novel wafer support insert ring having a convexly-curved inner surface to prevent or minimize the formation of polymer material on the inner surface of the ring.

Another object of the present invention is to provide a novel wafer support insert ring having a convexly-tapered inner surface to prevent or minimize the formation of polymer material on the inner surface of the ring.

Yet another object of the present invention is to provide a novel wafer support insert ring which prevents or minimizes the quantity of polymer material capable of accumulating in a berline wall or gap between the inner surface of the insert ring and the exterior circumference of an electrostatic chuck in a process chamber.

A still further object of the present invention is to provide a novel wafer support insert ring which extends the time between periodic maintenance or cleanings required for an etching chamber.

Yet another object of the present invention is to provide a novel wafer support insert ring which prevents or substantially reduces polymer peeling in a process chamber for semiconductor wafer substrates.

SUMMARY OF THE INVENTION

In accordance with these and other objects and advantages, the present invention is generally directed to a new and improved insert ring for a wafer support inside a processing chamber for the processing, particularly dry etching, of semiconductor wafer substrates. The insert ring includes a generally convex inner surface which faces the wafer support and defines a gap or berline wall between the insert ring and the wafer support. In one embodiment, the convex inner surface is convexly-tapered. In another embodiment, the convex inner surface is convexly-curved. Throughout etching of multiple successive substrates on the wafer support, accumulations of polymer material on the inner surface of the insert ring are prevented or at least substantially reduced. Consequently, polymer peeling is eliminated or reduced and operational intervals for the processing chamber or system between periodic maintenance or cleanings, are prolonged.

BRIEF DESCRIPTION OF THE DRAWINGS

The invention will now be described, by way of example, with reference to the accompanying drawings, in which:

FIG. 5 is a top view of an insert ring of the present invention, mounted in functional position around a wafer support, and illustrating a wafer provided on the wafer support;

FIG. 5A is a cross-sectional view, taken along section lines 5A-5A in FIG. 5;

FIG. 6A is a cross-sectional view illustrating the absence of polymer material accumulation between the insert ring and the wafer support, upon initial use of the insert ring in implementation of the present invention;

FIG. 6B is a cross-sectional view illustrating partial accumulation of polymer material on the outer circumference of the wafer support during use of the insert ring of the present invention;

FIG. 6C is a cross-sectional view illustrating full accumulation of polymer material on the exterior circumference of the wafer support after prolonged use of the insert ring of the present invention; and FIG. 7 is a cross-sectional view illustrating the absence of polymer material accumulation between the convex insert ring and the waver support, upon initial use of the convex insert ring in implementation of the present invention.

DESCRIPTION OF THE PREFERRED EMBODIMENTS

The present invention has particularly beneficial utility in preventing the accumulation of polymer residues on the inner surface of an insert ring during use of the insert ring in an etching chamber for the etching of circuit patterns in semiconductor wafer substrates. However, the insert ring of the present invention may be equally applicable to preventing or minimizing the accumulation of polymer materials on the inner surface of the insert ring during the use of various other types of process chambers used in the fabrication of integrated circuits, as well as process chambers or systems used in a variety of industrial applications.

Figure 4:
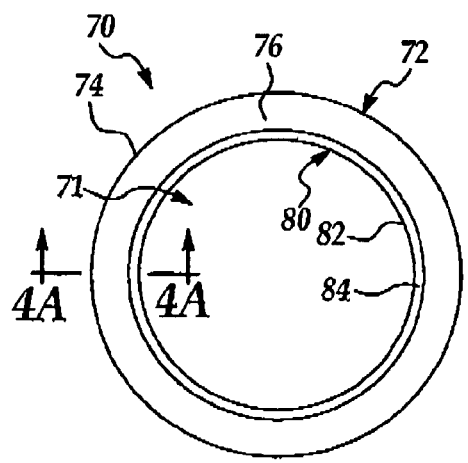
FIG. 4 is a top view of an insert ring in accordance with the present invention.
Figure 4A:
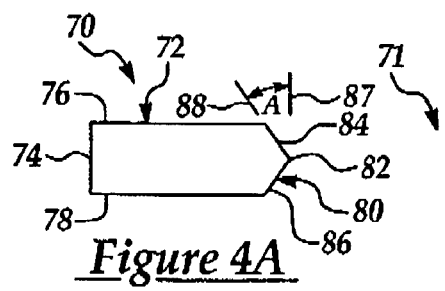
FIG. 4A is a cross-sectional view of a convex-tapered insert ring embodiment of the present invention, taken along section lines 4A-4A in FIG. 4.
Figure 4B:
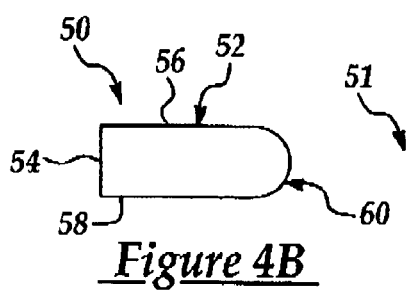
FIG. 4B is a crosssectional view of a convex-curved insert ring embodiment of the present invention.

Referring initially to FIGS. 4 and 4A, a preferred embodiment of the insert ring 70 of the present invention includes an annular ring body 72 that defines a central opening 71. The ring body 72 is typically constructed of silicon and includes an outer surface 74, an upper surface 76, a lower surface 78 and a convex, tapered inner surface 80. As shown in FIG. 4A, the tapered inner surface 80 may have a midpoint 82 that defines a planar upper face 84 extending between the upper surface 76 and the midpoint 82 and a planar lower face 86 extending between the lower surface 78 and the midpoint 82. The angle "A" defined by a plane 87 which is perpendicular to the upper surface 76 and a face plane 88 that corresponds to the plane of the upper face 84 is typically from about 20 degrees to about 24 degrees, and preferably, about 24 degrees. Similarly, the angle between the plane 87 and the plane of the lower face 86 is typically from about 20 degrees to about 24 degrees, and preferably, about 24 degrees. It is understood that the tapered inner surface 80 may have more than two faces arranged in a multi-faceted convex configuration, as desired. In another embodiment of the present invention, shown in FIG. 4B, the insert ring 50 includes an annular ring body 52 that defines a central opening 51 and has an outer surface 54, an upper surface 56, a lower surface 58 and a convex, curved inner surface 60.

Figure 1:
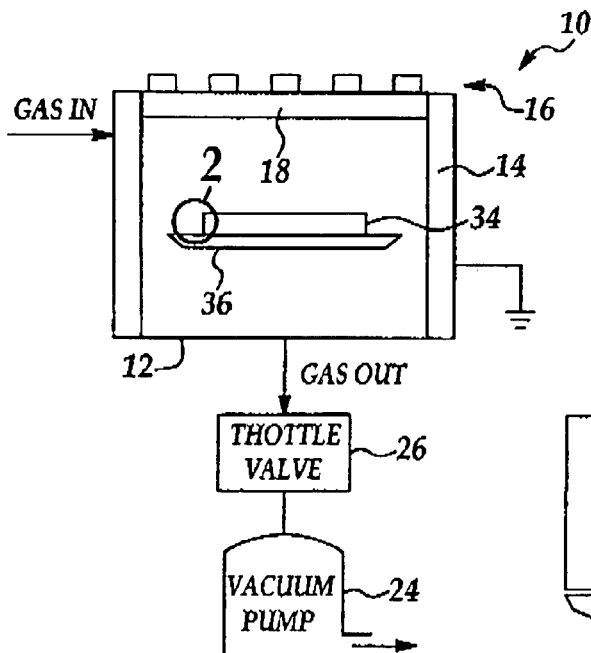
FIG. 1 is a schematic view of a typical conventional plasma etching system.
Figure 2:
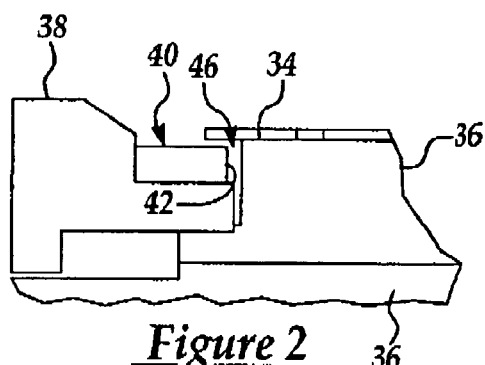
FIG. 2 is a sectional view, taken along section line 2 in FIG. 1.
Figure 3:
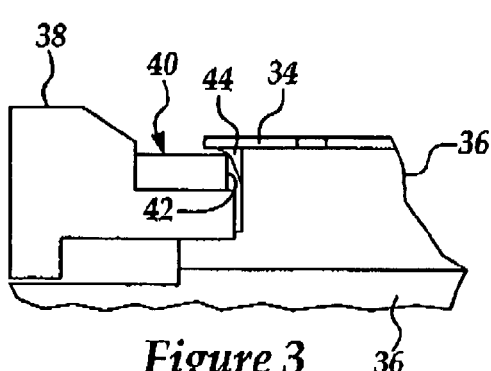
FIG. 3 is a sectional view taken along section line 2 in FIG. 1, illustrating accumulation of polymer material in a berline wall or gap between the inner surface of a conventional insert ring and the outer surface of a wafer support inside a plasma etch chamber.

Referring next to FIGS. 5 and 5A, in application the insert ring 70 of the present invention is typically used as a part of an insert ring assembly 90 in a process chamber 12 (FIG. 1) such as a Super-E etching chamber available from Applied Materials, Inc. The insert ring assembly 90 includes a shadow ring 91 that may be conventional and encircles an ESC 92 in the process chamber. The insert ring 70 is disposed between the shadow ring 91 and the ESC 92, and is typically supported on a flange 91a of the insert ring assembly 90, in conventional fashion as shown in FIG. 5A. Accordingly, the outer surface 74 of the insert ring 70 abuts against the annular inner surface of the shadow ring 91, and a gap or berline wall 94 is defined between the tapered inner surface 80 of the insert ring 70 and the annular outer surface 95 of the ESC 92. A semiconductor wafer 93 is supported on the ESC 92, and the edge 93a of the wafer 93 may extend over the gap 94.

Referring next to FIGS. 6A-6C, after shortterm use of the process chamber (not shown) in which the insert ring 70 is installed in the insert ring assembly 90, little or no polymer residue 96 has accumulated on the outer surface 95 of the ESC 92, as shown in FIG. 6A. Throughout repeated use of the insert ring 70 for processing of multiple successive wafers 93, however, polymer residue 96 begins to gradually become deposited on the flat outer surface 95 of the ESO 92, as shown in FIG. 6B. After prolonged use of the insert ring 70, as shown in FIG. 6C, a sufficient quantity of the polymer residue 96 has accumulated on the ESO 92 that the polymer residue 96 protrudes into the gap 94. Due to the configuration of the tapered inner surface 80 of the insert ring 70, however, the polymer residue 96 fails to accumulate on the tapered inner surface 80. consequently, polymer peeling is substantially reduced or eliminated and normal gas flow characteristics are sustained inside the process chamber, including normal helium flow around the backside of the wafer 93. As a result, prolonged usage of the insert ring 70 is possible without the need for maintaining, cleaning and/or replacing the insert ring 70 between periodic maintenance cycles. It has been found that use of an insert ring having the convex inner surface as shown in FIG. 7, in accordance with the present invention, increases periodic maintenance (PM) intervals up to 25%.

While the preferred embodiments of the invention have been described above, it will be recognized and understood that various modifications can be made in the invention and the appended claims are intended to cover all such modifications which may fall within the spirit and scope of the invention.

What is claimed is:

1. An insert ring for a process chamber to reduce material accumulations on an inner surface thereof, comprising:
   an insert ring body comprising an inner diameter surface defining a central opening, said insert ring body positioned on a shadow ring to surround a substrate support to form a gap there between;
   wherein, said inner diameter surface comprises a convex tapered geometry, said convex tapered geometry comprising at least two planar faces to form respective upper and lower tapered surfaces, said upper and lower tapered surfaces intersecting adjacent to said substrate support to form an angled corner defining a narrow most portion of said gap.
   wherein said upper and lower tapered surfaces each form an angle of about 20 degrees to about 24 degrees with respect to a vertical direction parallel to said outer diameter of said substrate support.

2. The insert ring of claim 1 wherein said ring body comprises silicon.

3. The insert ring of claim 1 wherein said insert ring is supported on said shadow ring to underlie a substrate placed on the substrate support surface.

4. An insert ring assembly for a process chamber to reduce polymer deposition and peeling on an inner diameter surface thereof in a dry etch process, comprising:
   an insert ring body supported on a shadow ring, said insert ring body comprising said inner diameter surface, said insert ring body positioned on said shadow ring to surround a substrate support to form a gap between said inner diameter surface and said substrate support, said gap positioned underlying a substrate edge portion;
   wherein, said inner diameter surface comprises a convex tapered surface, said tapered surface comprising at least two planar faces, said at least two planar faces extending between an upper surface and a lower surface of said ring body to form a tipped portion defining a narrowmost portion of said gap;
   wherein said convex tapered surface comprises a midpoint defining said tipped portion, said midpoint substantially equidistant between said upper surface and said lower surface, said at least two planar faces comprising an upper face extending between said midpoint and said upper surface and a lower face extending between said midpoint and said lower surface;
   wherein said upper face and said lower face each form an angle of about 20 degrees to about 24 degrees with respect to a vertical direction to form said tipped portion at said midpoint.

5. The insert ring assembly of claim 4 wherein said ring body comprises silicon.

6. The insert ring assembly of claim 4 wherein said ring body comprises silicon.

7. The insert ring assembly of claim 4 wherein said ring body comprises silicon.

8. An insert ring for a process chamber to reduce material accumulations on an inner surface thereof, comprising:
   an insert ring body supported on a shadow ring, said insert ring comprising an inner diameter surface defining a central opening, said insert ring body positioned on said shadow ring surrounding and underlying an upper surface of a substrate support to form a gap between an outer diameter of said substrate support and said inner diameter surface;

wherein, said inner diameter surface comprises planar upper and lower tapered surfaces forming a tipped portion to define a narrowmost portion of said gap;

wherein said planar upper and lower tapered surfaces each form an angle of about 20 degrees to about 24 degrees with respect to a vertical direction parallel to said outer diameter of said substrate support.

9. The insert ring of claim 8 wherein said tipped portion comprises a midpoint substantially equidistant between said upper and lower tapered surfaces.

10. The insert ring of claim 8 wherein said insert ring body comprises silicon.

* * * * *